United States Patent [19]
Miyashita et al.

[11] Patent Number: 5,886,578
[45] Date of Patent: Mar. 23, 1999

[54] DIFFERENTIAL AMPLIFIER INCLUDING BIAS CIRCUIT WITH BIAS RESISTOR

[75] Inventors: Miyo Miyashita; Kazuya Yamamoto, both of Tokyo, Japan

[73] Assignee: Mitsubishi Denki Kabusiki Kaisha, Tokyo, Japan

[21] Appl. No.: 883,455

[22] Filed: Jun. 26, 1997

[30] Foreign Application Priority Data

Nov. 25, 1996 [JP] Japan ..................................... 8-313765

[51] Int. Cl.⁶ ..................................................... H03F 3/45
[52] U.S. Cl. ........................ 330/253; 330/301; 330/308; 330/311
[58] Field of Search .............................. 330/59, 117, 148, 330/253, 275, 277, 301, 308, 310, 311

[56] References Cited

U.S. PATENT DOCUMENTS 5,237,289  8/1993  Han .......................................... 330/277

FOREIGN PATENT DOCUMENTS 3201117  9/1991  Japan .

OTHER PUBLICATIONS

Anan B. Grebene, "Bipolar and MOS Analog Integrated Circuit Design", pp. 230–233 and pp. 274–277.

*Primary Examiner*—James B. Mullins
*Attorney, Agent, or Firm*—Leydig, Voit & Mayer

[57] ABSTRACT

A differential amplifier receiving a first input signal and a second input signal, respectively, and amplifying voltage difference between the first and second input signals to output an output signal includes a first source follower circuit receiving an external data signal as the first input signal, and having an output node; a second source following circuit having a constant current source FET and receiving a reference voltage as the second input signal; and a bias circuit providing a signal having the same phase as the data signal from the output node of the first source follower circuit and inputting that signal to a gate terminal of the constant current source FET of the second source follower circuit. By providing an input interface circuit connected to an external signal source and producing a phase inversion signal from an input data signal in a differential amplifier or in a first stage differential amplifier connected to other amplifiers in multiple stages, the differential gain can be improved to a value approximately equal to that obtained when differential inputs are supplied.

9 Claims, 17 Drawing Sheets

DIFFERENTIAL AMPLIFIER INCLUDING BIAS CIRCUIT WITH BIAS RESISTOR

FIELD OF THE INVENTION

The present invention relates to a differential amplifier and, more particularly, to a differential amplifier that can produce a satisfactory voltage gain in a wide range of operating frequencies exceeding a few GHz, which is suitable for a single end input interface.

BACKGROUND OF THE INVENTION

FIG. 14 is a circuit diagram illustrating a prior art differential amplifier having an input interface, for example, which is described in "Bipolar and MOS Analog Integrated Circuit design" written by Alan B. Grebene. In the figure, reference numeral 1 designates a first level shift circuit for dropping a DC voltage of an input signal D to a constant level, numeral 2 designates a second level shift circuit for dropping an input reference voltage $V_R$ by the same amount as in the first level shift circuit 1, and numeral 3 designates a differential amplifier that is connected directly or cascade-connected to the first and second level shift circuits 1 and 2 and is connected to the next stage through another level shift circuit (not shown).

In the first level shift circuit 1, reference numeral 4 designates a source follower field effect transistor (hereinafter referred to as an FET), numeral 5 designates a constant current source FET, numeral 6 designates a level shift diode comprising one diode or a plurality of diodes connected in series, and the anode electrode of the level shift diode 6 is connected to the source electrode of the source follower FET 4. The input signal D is input to the gate terminal of the source follower FET 4. The level shift diode 6 drops the DC voltage of the input signal D by an amount corresponding to a forward voltage that is produced due to a current supplied from the constant current source FET 5. For example, when a GaAs Schottky diode is employed as the diode, the amount of level shift is about 0.6 V per diode. In the second level shift circuit 2, reference numeral 7 designates a source follower FET, numeral 9 designates a constant current source FET, and numeral 8 designates a level shift diode comprising one diode or a plurality of diodes connected in series. Similarly, in the second level shift circuit 2, the input reference voltage $V_R$ is input to the gate terminal of the source follower FET 7, and it is dropped through the level shift diode 8 to be output.

In the differential amplifier 3, reference numerals 10 and 11 designate FETs serving as a source coupled transistor pair, and a high frequency signal is input to the gate of the FET 10 and a DC voltage is supplied to the gate of the FET 11. Reference numeral 12 designates a level shift diode for dropping a DC voltage of an output signal. Reference numerals 13 and 14 designate load resistors that are respectively connected in series to the drains of the FETs 10 and 11. Reference numeral 15 designates a constant current source that is connected to the sources of the FETs 10 and 11 constituting the source coupled transistor pair.

A description is given of the operation of the differential amplifier 3 utilizing signal waveforms shown in FIG. 15(a). At an arbitrary time $T_{arb}$, the data signal $V_1$, shown by a solid line in the figure, $$V_1 = V_D + V_{D\_PP},$$

is input to the gate electrode of the FET 10, and the phase inversion signal $V_2$ shown by a dotted line in the figure, $$V_2 = V_D - V_{D\_PP},$$

is input to the gate terminal of the FET 11. The common-mode component $V_{com}$ and the differential component $V_{dif}$ included in common in two inputs of the differential amplifier 3 are defined as follows:

$$V_{com} = (V_1 + V_2)/2 = V_D$$

$$V_{dif} = (V_1 - V_2)/2 = V_{D\_PP}$$

By using these equations, the input signals of the differential amplifier 3 can be expressed as:

$$V_1 = V_{com} + V_{dif}$$

$$V_2 = V_{com} - V_{dif}$$

The output voltage $V_{OUT}$ at the output OUT, a node between the FET 10 and the load resistor 13, and the output voltage $V_{/OUT}$ at the output /OUT, serving as a node between the FET 11 and the load resistor 14, are represented by:

$$\begin{aligned} V_{OUT} &= Ac \cdot V_{com} + Ad \cdot V_{dif} \\ &= Ac \cdot V_D + Ad \cdot V_{D\_PP} \\ V_{/OUT} &= Ac \cdot V_{com} - Ad \cdot V_{dif} \\ &= Ac \cdot V_D - Ad \cdot V_{D\_PP} \end{aligned}$$

where Ad is the differential gain and Ac is the common-mode gain of the differential amplifier 3. Assuming that the difference $\Delta V_{OUT}$ between the output voltages at two output ends is an output, $\Delta V_{OUT}$ becomes:

$$\begin{aligned} \Delta V_{OUT} &= (V_{OUT} - V_{/OUT}) \\ &= (Ac \cdot V_{com} + Ad \cdot V_{dif}) - (Ac \cdot V_{com} - Ad \cdot V_{dif}) \\ &= 2 \cdot Ad \cdot V_{dif} \\ &= 2 \cdot Ad \cdot V_{D\_PP} \end{aligned}$$

Therefore, only the gain of the differential component can be obtained.

A description is given of the operation of the differential amplifier 3 when single end input as shown in FIG. 15(b). In the case of the single end input, the DC voltage $V_2 = V_D$ (shown by a dotted line in the figure) is supplied to the gate terminal of the FET 11. The common-mode component $V_{com}$ and the differential component $V_{dif}$ are expressed as:

$$V_{com} = (V_1 + V_2)/2 = V_D + V_{D\_PP}/2$$

$$V_{dif} = (V_1 - V_2)/2 = V_{D\_PP}/2$$

In addition, the output voltages at the respective output ends are represented by:

$$\begin{aligned} V_{OUT} &= Ac \cdot V_{com} + Ad \cdot V_{dif} \\ &= Ac \cdot (V_D + V_{D\_PP}/2) + Ad \cdot V_{D\_PP}/2 \\ V_{/OUT} &= Ac \cdot V_{com} - Ad \cdot V_{dif} \\ &= Ac \cdot (V_D + V_{D\_PP}/2) - Ad \cdot V_{D\_PP}/2 \end{aligned}$$

The difference $\Delta V_{OUT}$ between the voltages becomes:

$$\begin{aligned} \Delta V_{OUT} &= 2 \cdot Ad \cdot V_{dif} \\ &= Ad \cdot V_{D\_PP} \end{aligned}$$

Therefore, from the relationship between the amplitude $V_{D\_PP}$ of the input signal $V_1$ and the voltage difference ΔV$_{OUT}$, it is found that the gain for a single end input becomes ½ of the gain for a differential input. FIGS. 16(a)–16(c) are diagrams showing the relationship among input waveforms (FIG. 16(a)) and output waveforms (FIG. 16(b)) of the level shift circuits 1 and 2 and output waveforms (FIG. 16(c)) of the differential amplifier 3 at the single end input, with the time base as a reference. As is known from FIG. 16(b), in the single end input, since the input V$_R$ of the second level shift circuit 2 is a constant voltage, its output has a flat waveform reflecting the input.

In recent years, long-haul transmission has progressed in optical communication systems, and high-speed and high-sensitivity are demanded of optical transmitters-receivers used for the optical communication systems. An optical transmitter-receiver comprises a wideband amplifier, a dicision circuit for discriminating H level from L level of an input signal, and a driver for driving a laser diode, or the like. When transmission speed exceeding Gbps is required, these circuits are often constituted of differential amplifiers or source coupled type FET logics (SCFL), having an advantage of high speed. For example, in order to improve the input sensitivity of the decision circuit, it is necessary to increase the gain (differential gain Ad) of an input buffer comprising a differential amplifier. When differential signals, i.e., a data signal and a phase inversion signal, are input to two input terminals of the differential amplifier, the phase difference between the two inputs must be precisely adjusted. For that, it is required to adjust lengths of wirings which connect the signal sources and the inputs of the circuit, or to provide a phase adjusting circuit at one of the input terminals, so that the system design becomes complicated. Therefore, single end input is generally used. Consequently, although the gain should be increased, the gain is reduced by half because of the single end input.

More specifically, in the differential amplifier 3, the differential gain Ad is in proportion to transconductance gm of the source coupled FETs 10 and 11, and the resistance of the load resistors 13 and 14. Accordingly, in order to increase the gain, the transconductance gm, the resistance, or both of them may be increased. However, when an FET having a determined gate length is employed, the gate width of the FET must be increased in order to increase the transconductance gm, causing an increase in the gate-source capacitance or the gate-drain capacitance of the FET. Meanwhile, when the load resistance is increased, the CR time constant of the load resistance and the parasitic capacitance of the loads connected to the output ends, such as the input capacitance of the FETs connected to the outputs OUT and /OUT of the next stage, increases.

As a result, the increase in the transconductance gm or the resistance value causes band degradation, i.e., a reduction of the band in which a desired gain can be obtained, in a band where the input buffer is used. That is, as shown in FIG. 17, although a desired gain has usually been obtained up to a region of a frequency f, the desired gain is obtained only up to a region of a frequency f' lower than the frequency f. In addition, when the number of stages of differential amplifiers (input buffers) is increased in order to make the gain higher, the influence due to the band degradation described above becomes larger as the signal is transmitted from the amplifier of the previous stage to the amplifier of the next stage, whereby the band degradation is promoted and an increase in current is caused. Because of the above-described facts, it is difficult to make the gain higher by using a differential amplifier in optical transmitters-receivers for optical communication systems exceeding 10 Gbps, increasing the transconductance gm of the source coupled FETs constituting the differential amplifier and the resistance of the resistors connected in series to the respective source coupled FETs.

The prior art differential amplifier is constituted as described above, and the gain obtained with a single end input is below half of the gain for a differential input.

SUMMARY OF THE INVENTION

It is an object of the present invention to provide a differential amplifier that can obtain a satisfactory gain even when a single end input is used.

Other objects and advantages of the present invention will become apparent from the detailed description given hereinafter; it should be understood, however, that the detailed description and specific embodiments are given by way of illustration only, since various changes and modifications within the scope of the invention will become apparent to those skilled in the art from this detailed description.

According to a first aspect of the present invention, a differential amplifier inputting a first input signal and a second input signal, respectively, and amplifying the voltage difference between the first and second input signals to output an output signal, includes a first source follower circuit externally inputting a data signal as the first input signal, and having an output node; a second source follower circuit having a constant current source FET, and inputting a signal having a reference voltage as the second input signal; and a bias circuit taking out a signal having the same phase as that of the data signal from the output node of the first source follower circuit and inputting that signal to the gate terminal of the constant current source FET of the second source follower circuit. By providing an input interface circuit connected to an external signal source with a function for producing a phase inversion signal of an input data signal, in a differential amplifier, or in a first stage differential amplifier among those connected in multiple stages, the differential gain can be improved to a value approximately equal to that which is obtained when the differential inputs are input.

According to a second aspect of the present invention, in the differential amplifier of the first aspect of the invention, the bias circuit comprises a by-pass condenser connecting the output node of the first source follower circuit from which the signal having the same phase as that of the data signal is taken out and the gate terminal of the constant current source FET of the second source follower circuit; and a bias resistor supplying the gate bias of the current source FET of the second source follower circuit. Therefore, by this construction of the bias circuit, the effect of the first aspect is obtained.

According to a third aspect of the present invention, in the differential amplifier of the first aspect of the invention, the bias circuit comprises a reverse-biased diode connecting the output node of the first source follower circuit from which the signal having the same phase as that of the data signal is taken out and the gate terminal of the constant current source FET of the second source follower circuit; and a bias resistor supplying the gate bias of the current source FET of the second source follower circuit. Therefore, the bias circuit can be realized in a relatively small element region, and its fabricating process can be facilitated.

According to a fourth aspect of the present invention, in the differential amplifier of the second aspect of the invention, an inductor is connected in series with the bias resistor to compensate the phase lag caused by the input capacitance of the current source FET of the second source follower circuit. Therefore, the differential amplifier can be used in a high frequency region, with suppressing the influences by the input capacitance of the current source FET of the second source follower circuit.

According to a fifth aspect of the present invention, in the differential amplifier of the second aspect of the invention, a resistor is connected in parallel with the by-pass condenser to compensate the phase lead caused by the by-pass condenser constituting the bias circuit. Therefore, the differential amplifier can be used even in a frequency band where the by-pass condenser cannot be regarded as short-circuited.

According to a sixth aspect of the present invention, in the differential amplifier of the first aspect of the invention, the bias circuit comprises a by-pass resistor connecting the output node of the first source follower circuit from which the signal having the same phase as that of the data signal is taken out and the gate terminal of the constant current source FET of the second source follower circuit; and a bias resistor supplying the gate bias of the current source FET of the second source follower circuit. Therefore, when the differential amplifier is used in a frequency region where the input impedance of the current source FET of the second source follower circuit is seen to be quite large, the structure thereof can be simplified.

According to a seventh aspect of the present invention, in the differential amplifier of the fifth aspect of the invention, a condenser is connected in parallel with the bias resistor supplying the gate bias of the current source FET of the second source follower circuit to increase the input capacitance of the current source FET of the second source follower circuit. Therefore, even when the input capacitance of the current source FET of the second source follower circuit is extremely small, the by-pass condenser can be constituted of such as an MIM capacitor with high precision.

According to an eighth aspect of the present invention, in the differential amplifier of the seventh aspect of the invention, a variable capacitance condenser is used as the condenser. Therefore, it is possible to absorb variations in fabrication processes when producing integrated circuits.

According to a ninth aspect of the present invention, in the differential amplifier of the eighth aspect of the invention, the variable capacitance condenser comprises an MIM capacitor obtained by dividing an upper electrode into plural parts and connecting the divided plural parts of the upper electrode with wirings, the wirings being cut as required to form a desired capacitance.

According to a tenth aspect of the present invention, in the differential amplifier of the eighth aspect of the invention, a diode is used as the variable capacitance condenser.

DETAILED DESCRIPTION OF THE PREFERRED EMBODIMENTS

Embodiment 1.

Figure 1:
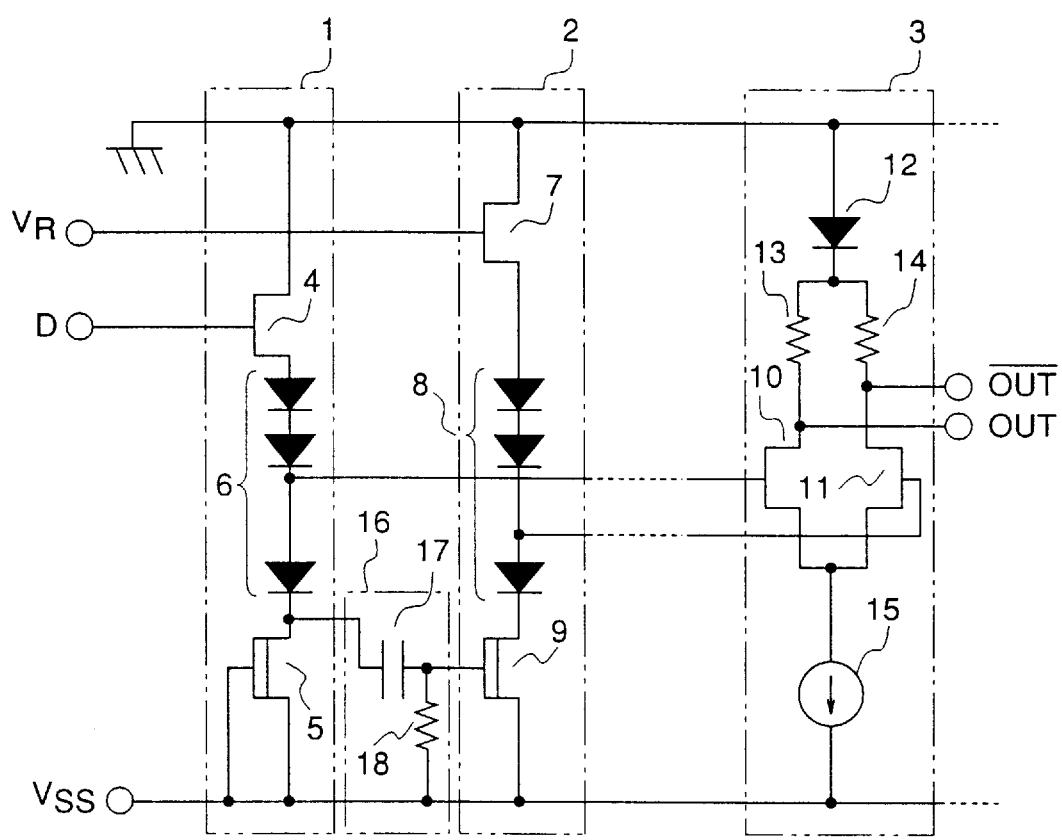
FIG. 1 is a circuit diagram illustrating a differential amplifier in accordance with a first embodiment of the present invention.
Figure 14:
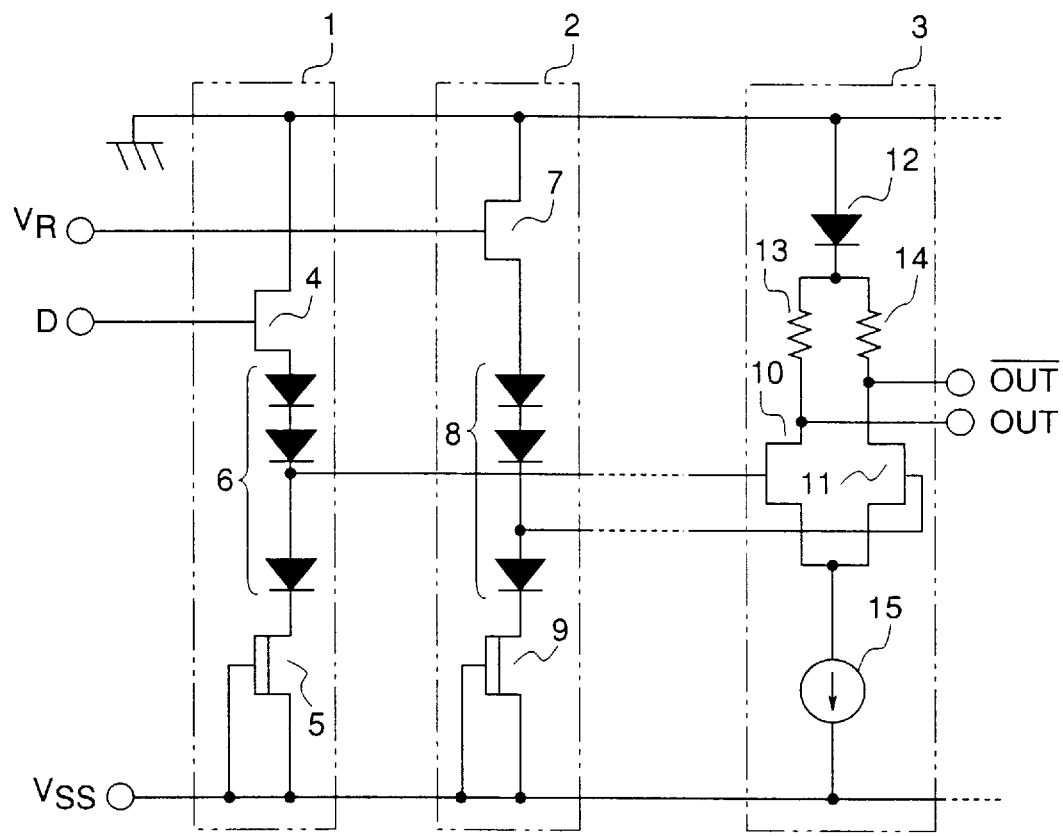
FIG. 14 is a circuit diagram illustrating a prior art differential amplifier.
Figure 15:
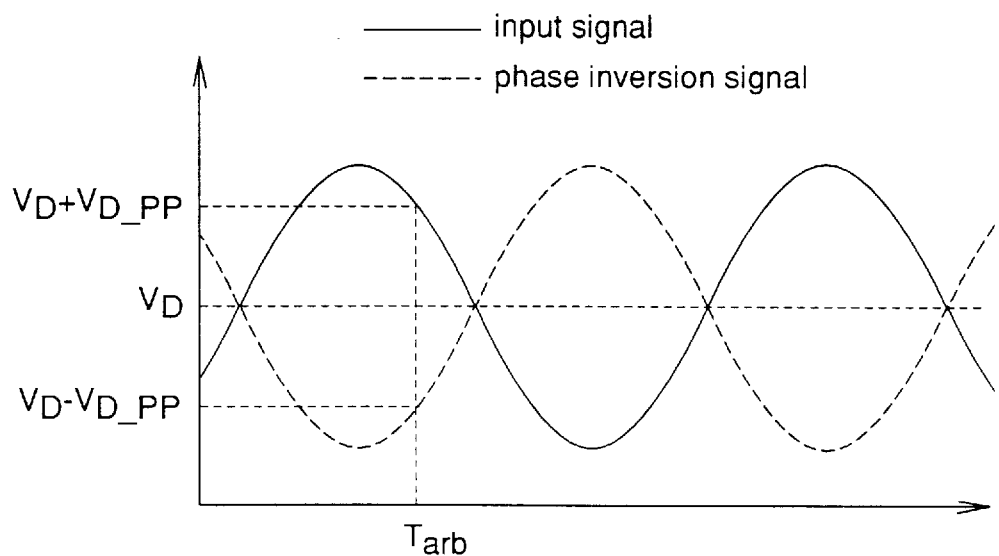
FIGS. 15(a) and 15(b) are diagrams showing signal waveforms input to two input terminals of the prior art differential amplifier.
Figure 15:
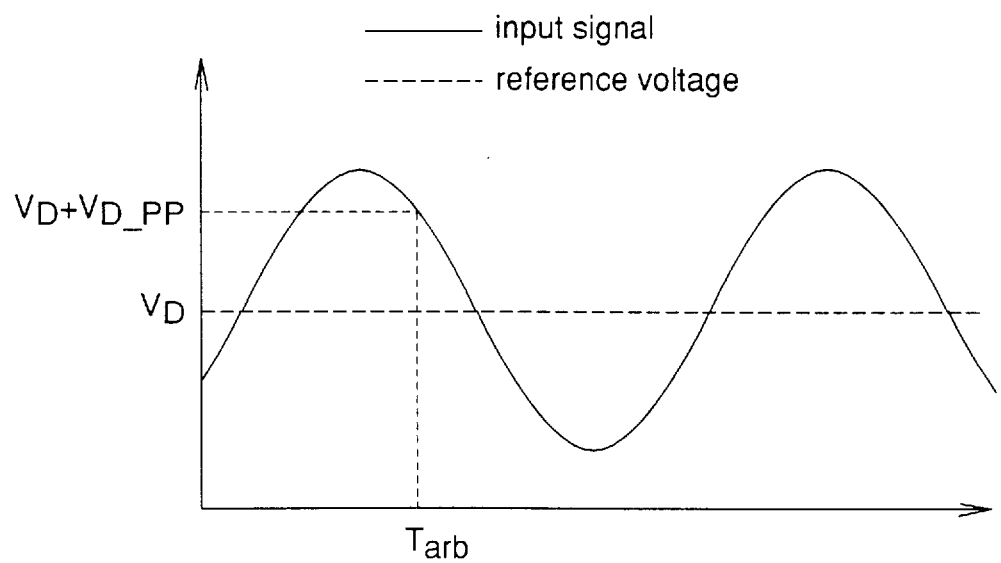
Figure 16:
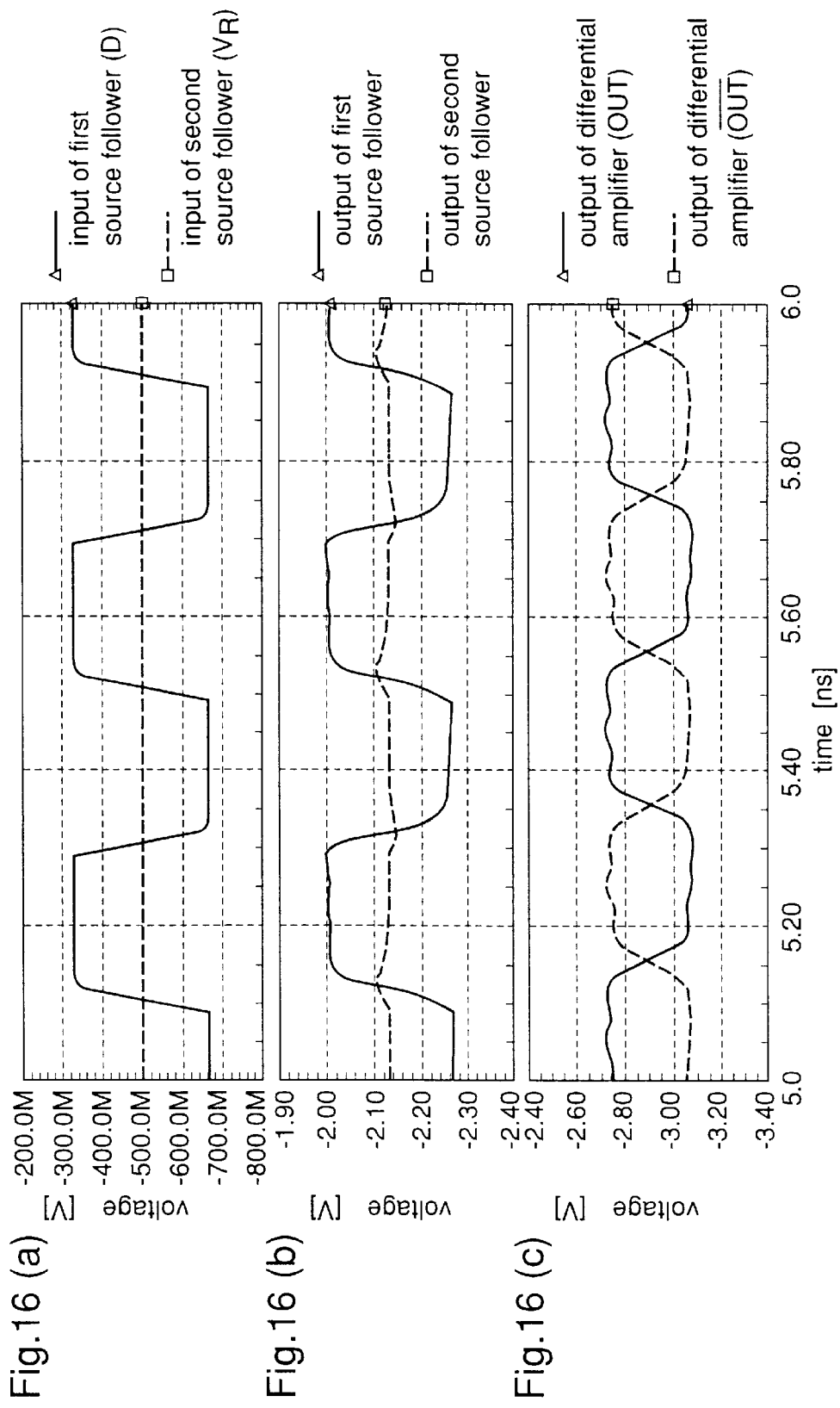
FIGS. 16(a)–16(c) are diagrams showing input waveforms and output waveforms of level shift circuits and output waveforms of the prior art differential amplifier.
Figure 17:
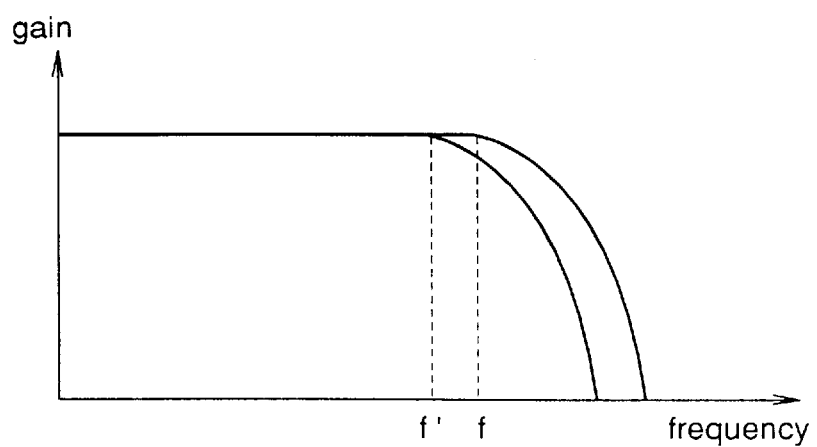
FIG. 17 is a diagram showing a relationship between frequency and gain of the prior art differential amplifier.

FIG. 1 is a circuit diagram illustrating a differential amplifier according to a first embodiment of the present invention. In the figure, the same reference numerals as those shown in FIG. 14 designate the same or corresponding parts. Reference numeral 16 designates a bias circuit for taking out a signal from the first level shift circuit 1 and inputting that signal to the gate terminal of the current source FET of the second level shift circuit 2. When a signal having the same phase as that of the input signal is input to the gate terminal of the current source FET 9 of the second level shift circuit 2 by the bias circuit 16, the current of the current source of the second level shift circuit 2 changes. In the bias circuit 16, the output of the first level shift circuit 1 is input to a by-pass condenser 17, and only the high-frequency signal is selected and output to the gate of the current source FET 9. In addition, a gate bias resistor 18 for compensating the gate bias of the current source FET 9 is disposed between the by-pass condenser 17 and the gate of the current source FET 9.

Figure 2:
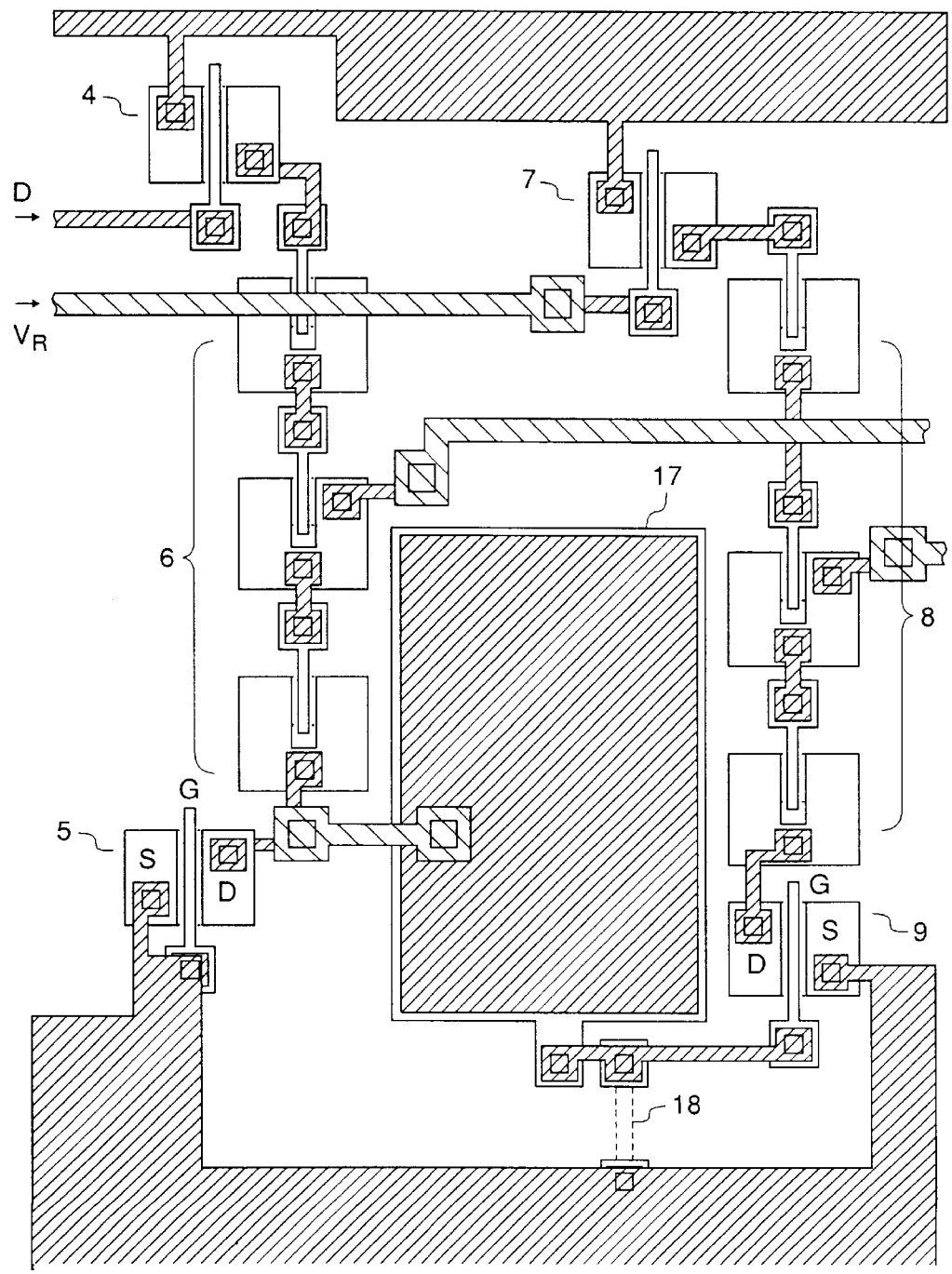
FIG. 2 is a diagram illustrating an instance of pattern layout of the differential amplifier according to the first embodiment of the invention.

FIG. 2 is a diagram illustrating pattern layout of an input interface circuit with an input phase inversion function comprising the source follower circuits 1 and 2 and the bias circuit 16, when the differential amplifier having the structure shown in FIG. 1 is an IC. In the figure, an MIM (metal insulator metal) structure is used as the by-pass condenser.

A description is given of the operation.

When the input signal D is at High level, the gate voltage of the current source FET 9 of the second level shift circuit 2 is increased, and the current flowing through the current source FET 9 increases. Simultaneously, the current flowing through the source follower FET 7 increases. Since the gate voltage of the source follower FET 7 is fixed to the constant level $V_R$, the source voltage of the source follower FET 7 decreases. When the input signal D is at Low level, the gate voltage of the current source FET 9 of the second level shift circuit 2 is decreased, and the current flowing through the current source FET 9 decreases, so that the source voltage of the source follower FET 7 increases.

When the bias circuit 16 is used, since the gate voltage of the current source FET 9 of the second level shift circuit 2 changer with $V_{SS}$ as its center, the first and second level shift circuits 1 and 2 output the same output levels representing the DC components. Concerning the RF components, the output signal from the second level shift circuit 2 has a phase opposite to that of the output signal from the first level shift circuit 1. Consequently, when the outputs of the first and second level shift circuits 1 and 2 are input to two input terminals of the differential amplifier 3 at the next stage, these inputs are just like differential inputs, so that the gain of the differential amplifier 3 is improved.

Figure 3:
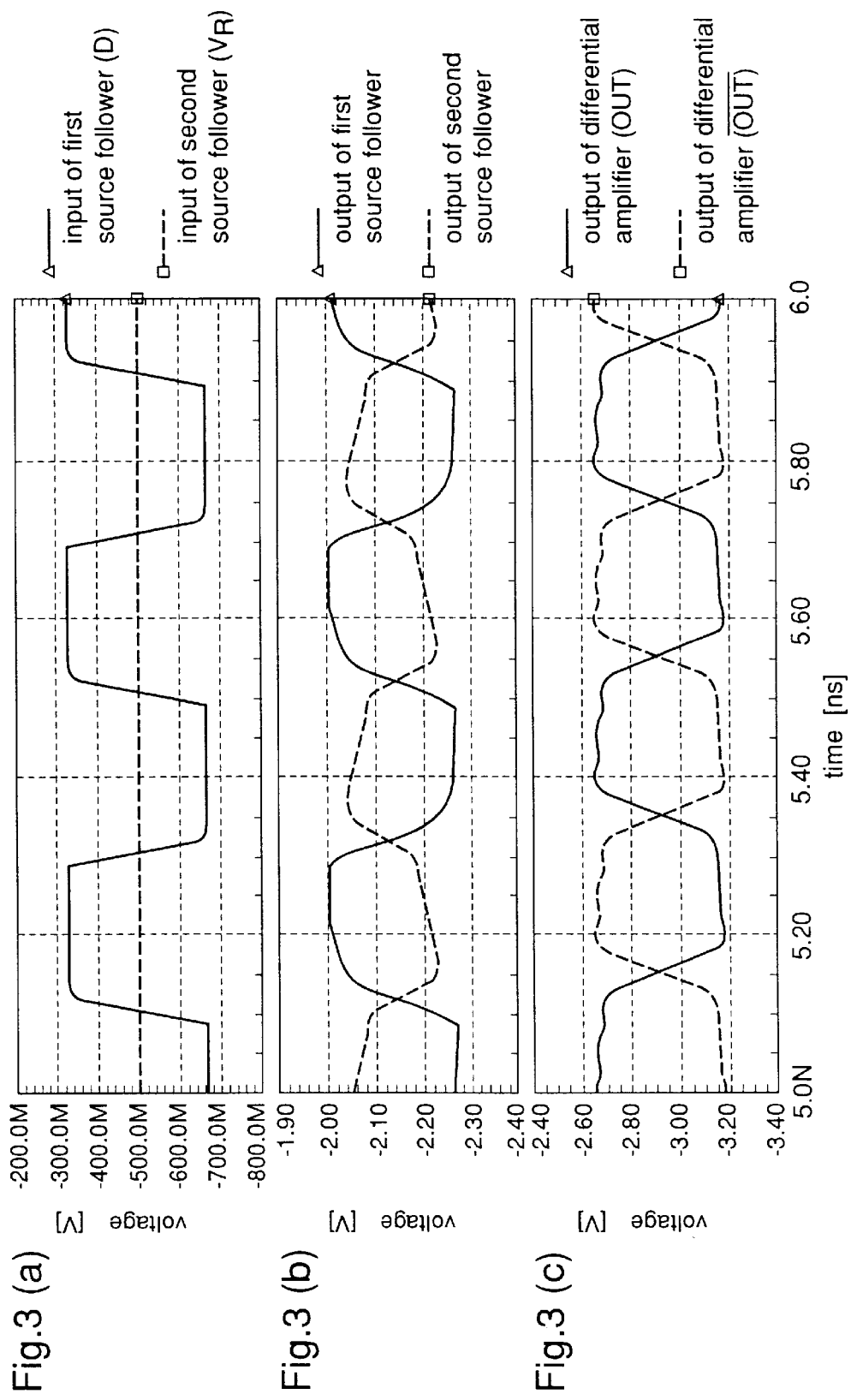
FIGS. 3(a)–3(c) are diagrams showing input waveforms and output waveforms of level shift circuits and output waveforms of the differential amplifier according to the first embodiment of the invention.

FIGS. 3(a)–3(c) are diagrams showing the relationship between input waveforms (FIG. 3(a)) and output waveforms (FIG. 3(b)) of the level shift circuits 1 and 2, and output waveforms (FIG. 3(c)) of the differential amplifier 3 with a the single end input, with the time base as a reference. As is apparent from FIG. 3(b), while in the single end input the input $V_R$ of the second level shift circuit 2 has a constant voltage, it has an output taken out from the first level shift circuit 1 and input to the current source FET 9 by means of the bias circuit 16. Therefore, the output of the second level shift circuit 2 has a waveform similar to the waveform obtained by inverting the output of the first level shift circuit 1.

Figure 4:
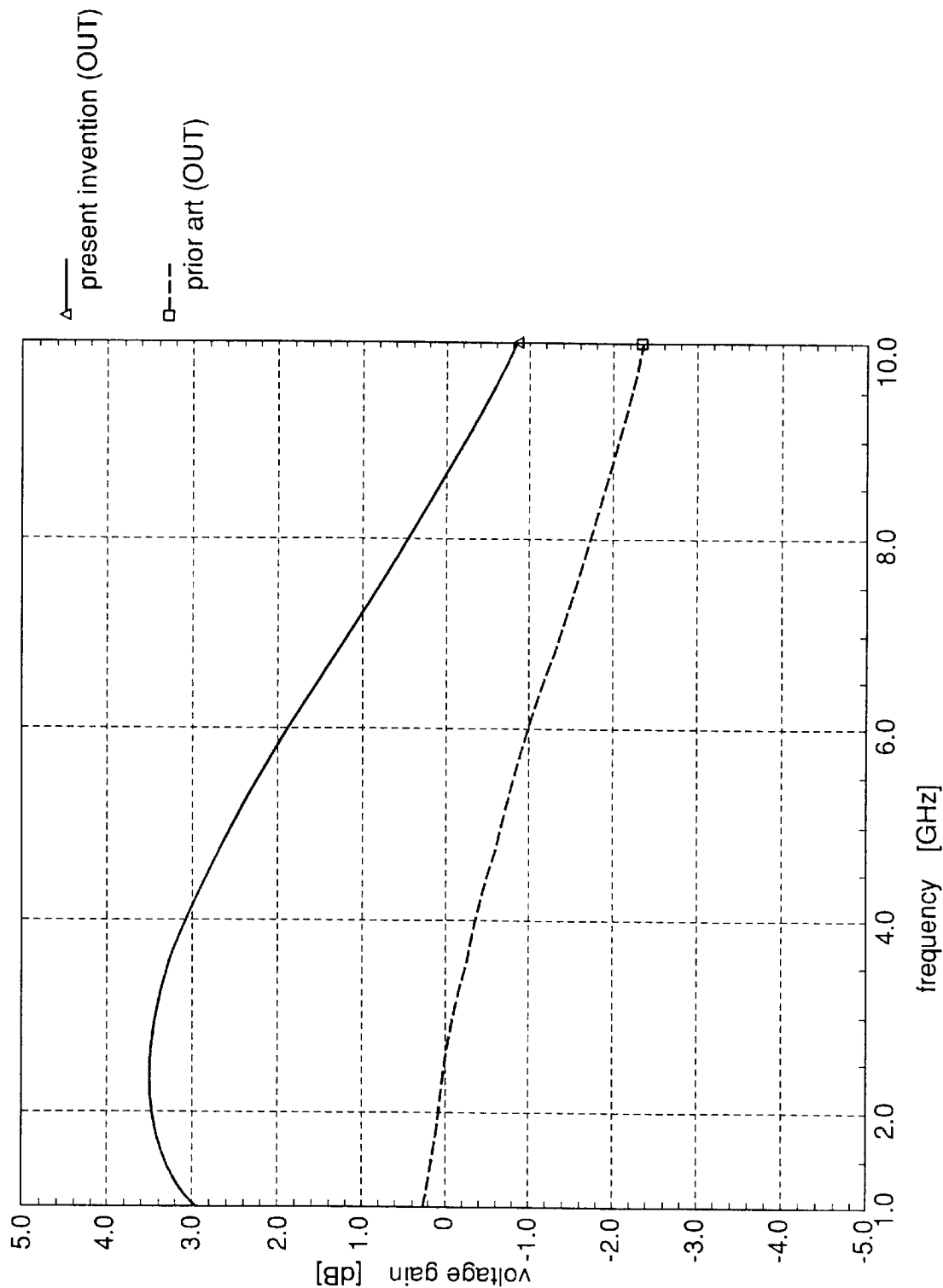
FIG. 4 is a diagram showing a relationship between frequency and gain of the differential amplifier according to the first embodiment of the invention.

FIG. 4 is a diagram showing simulation results representing the relationship between frequency and voltage gain when the single end input is employed using the differential amplifier according to the first embodiment of the invention. It is found from the figure that a higher gain is obtained than when the single end input is employed using the prior art differential amplifier.

As described above, according to the first embodiment of the invention, the bias circuit 16 takes the output of the first level shift circuit 1 to which the input signal D is input, and inputs the same to the gate of the current source FET 9 of the second level shift circuit 2 to which the reference voltage $V_R$ is input. Therefore, the second level shift circuit 2 always outputs a signal which is not a constant voltage but has a waveform having a phase opposite to that of the input signal D. Then, the outputs of the first and second level shift circuits 1 and 2 are input to two input terminals of the differential amplifier 3 of the next stage, directly or via another level shift circuit, whereby the differential amplifier 3 operates as if a differential input is employed, thereby resulting in a higher gain than for a single end input.

Embodiment 2.

Figure 5:
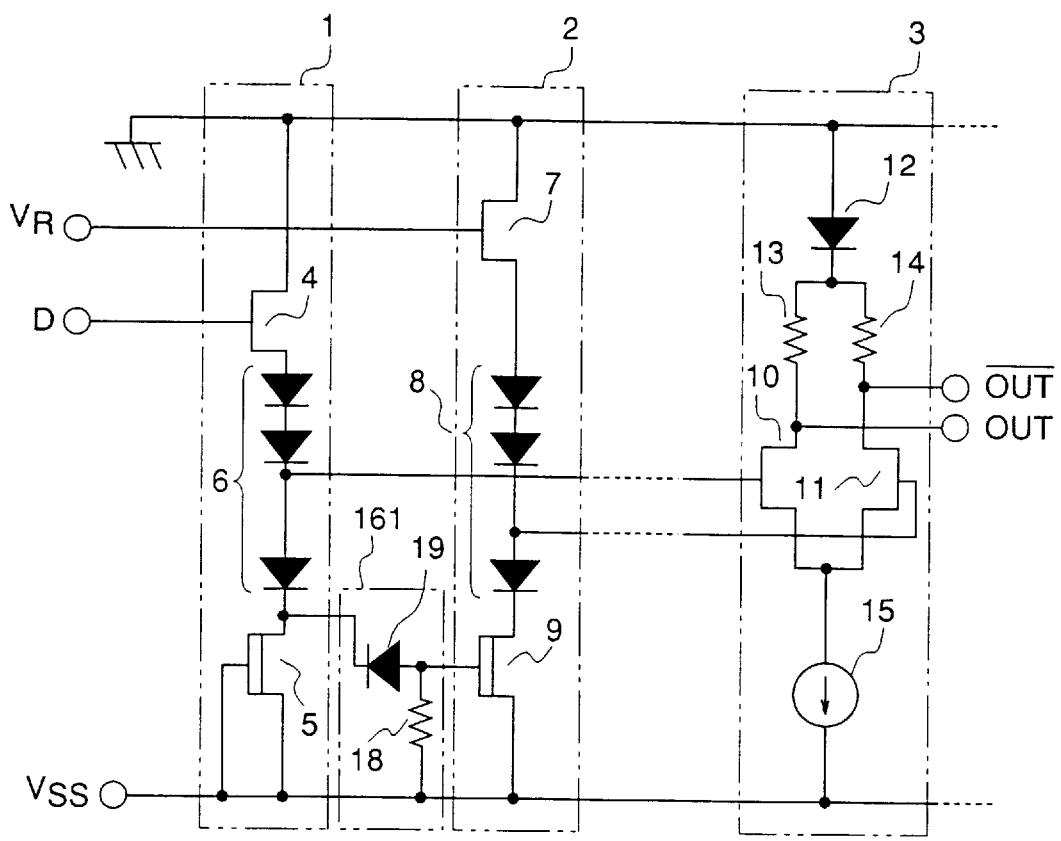
FIG. 5 is a circuit diagram illustrating a differential amplifier in accordance with a second embodiment of the present invention.

FIG. 5 is a circuit diagram illustrating a differential amplifier according to a second embodiment of the present invention. In the figure, the same reference numerals as those shown in FIG. 1 designate the same or corresponding parts. Reference numeral 161 designates a bias circuit for taking out a signal from the first level shift circuit 1 and inputting that signal to the gate terminal of the current source FET 9 of the second level shift circuit 2.

The second embodiment of the invention is characterized in that a diode 19 is substituted for the by-pass condenser 17 of the bias circuit according to the first embodiment.

More specifically, reference numeral 19 designates a reverse-biased diode that is used in place of the by-pass condenser 17 of the bias circuit shown in FIG. 1. An equivalent circuit of the reverse-biased diode 19 is represented by a resistance component and a capacitance component connected in series to each other. Therefore, this circuit performs the same operation as that in the first embodiment.

In the second embodiment of the invention, when, for example, a Schottky diode utilizing the Schottky characteristic of an FET is employed for the diode 19, the MIM process is not needed as when the MIM capacitor is used as in the first embodiment, thereby the number of process steps for fabrication can be reduced. Further, the area occupied by that element in pattern layout can be reduced, presenting an advantage in the circuit integration.

Embodiment 3.

Figure 6:
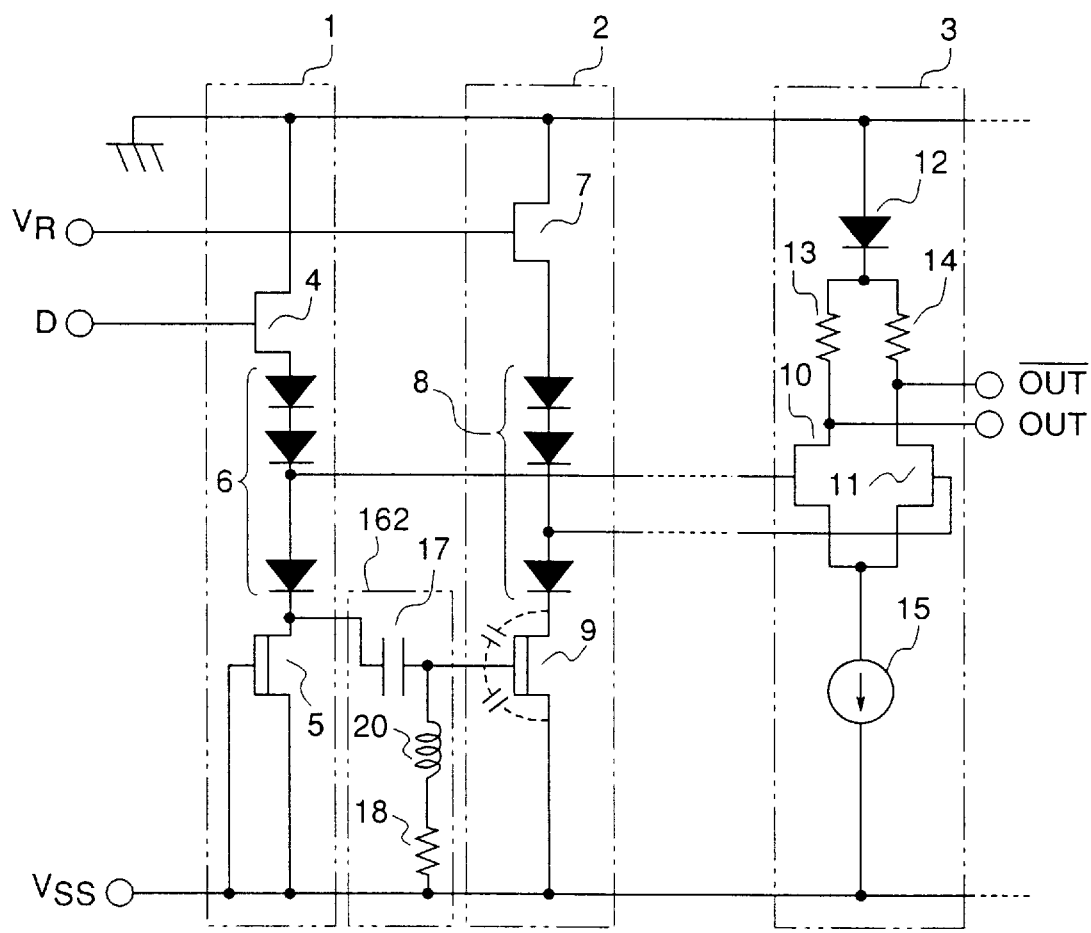
FIG. 6 is a circuit diagram illustrating a differential amplifier in accordance with a third embodiment of the present invention.

FIG. 6 is a circuit diagram illustrating a differential amplifier according to a third embodiment of the present invention. In the figure, the same reference numerals as those shown in FIG. 1 designate the same or corresponding parts. Reference numeral 162 designates a bias circuit for taking out a signal from the first level shift circuit 1 and inputting that signal to the gate terminal of the current source FET 9 of the second level shift circuit 2.

The third embodiment of the invention is characterized in that a phase compensating inductor 20 is provided between an end of the gate bias resistor 18 of the bias circuit according to the first embodiment and the gate terminal of the current source FET 9.

More specifically, in the circuits of the first and second embodiments, when a signal used is a high frequency signal, there appears the influence by the parasitic capacitance of the gate of the current source FET 9, whereby the voltage phase at the gate terminal of the current source FET 9 changes, i.e., voltage phase lag occurs. Then, the signal output from the second level shift circuit 2 is a phase inversion signal with respect to the signal output from the first level shift circuit 1. In the bias circuit 162 shown in FIG. 6, the voltage phase at the gate terminal of the current source FET 9 leads the serial circuit comprising the bias resistor 18 and the inductor 20. Therefore, the parallel circuit comprising the serial circuit and the condenser 17 decreases the phase changes of the signals output from the first and second level shift circuits 1 and 2 due to the gate parasitic capacitance of the current source FET 9. Consequently, a signal having a phase opposite to that of the signal output from the first level shift circuit 1 is obtained as the output of the second level shift circuit 2. For example, when the differential amplifier is employed for a circuit which requires sensitivity at a certain center frequency, such as a clock buffer circuit in a decision circuit, if the inductance of the inductor 20 is adjusted so as to satisfy, at a required center frequency, the condition shown by the following equation:

$$C = L/(R^2 + \omega^2 L^2)$$

where C represents the capacitance of the by-pass condenser 17, L represents the inductance of the inductor 20, R represents the resistance value of the bias resistor 18, and $\omega$ represents the angular frequency, the phase of the gate input signal of the current source FET 9 becomes just the same phase as that of the signal output from the first level shift circuit 1. As a result, the signal output from the first level shift circuit 1 has a phase opposite to that of the signal output from the second level shift circuit 2.

Embodiment 4.

Figure 7:
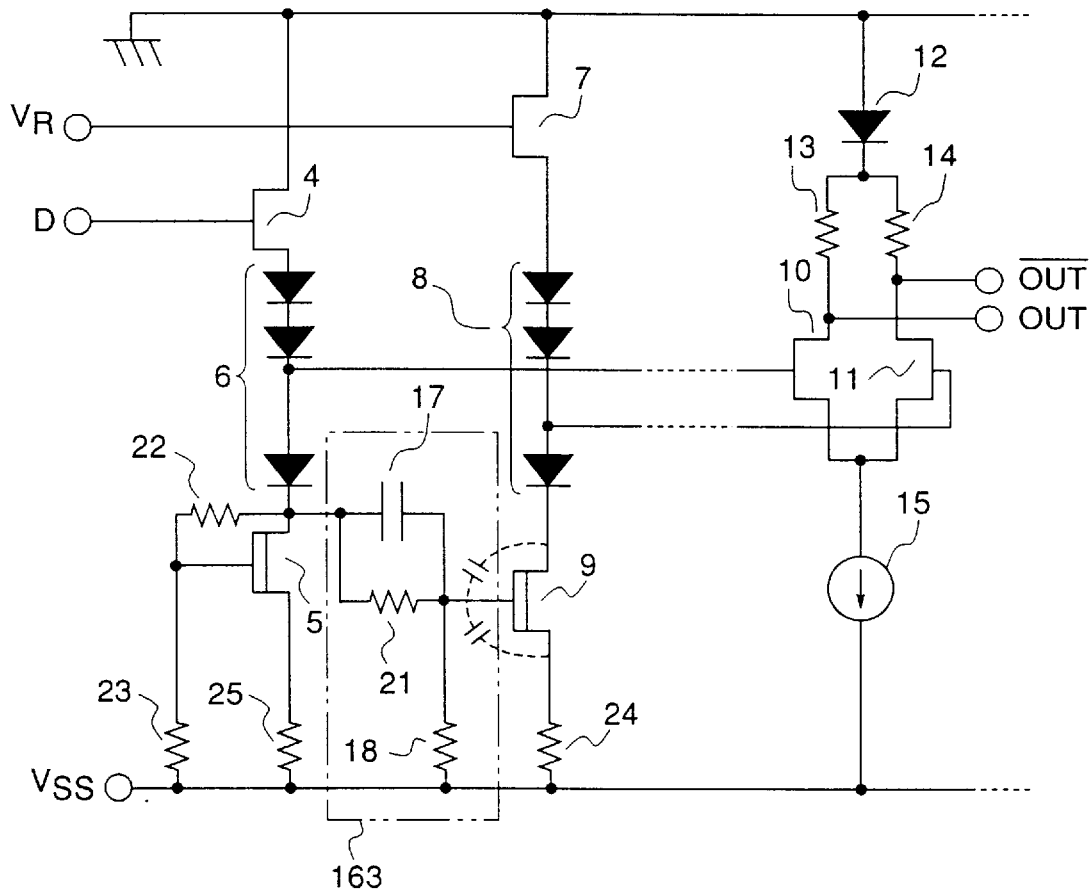
FIGS. 7(a) and 7(b) are circuit diagrams illustrating a differential amplifier in accordance with a fourth embodiment of the present invention.
Figure 7:
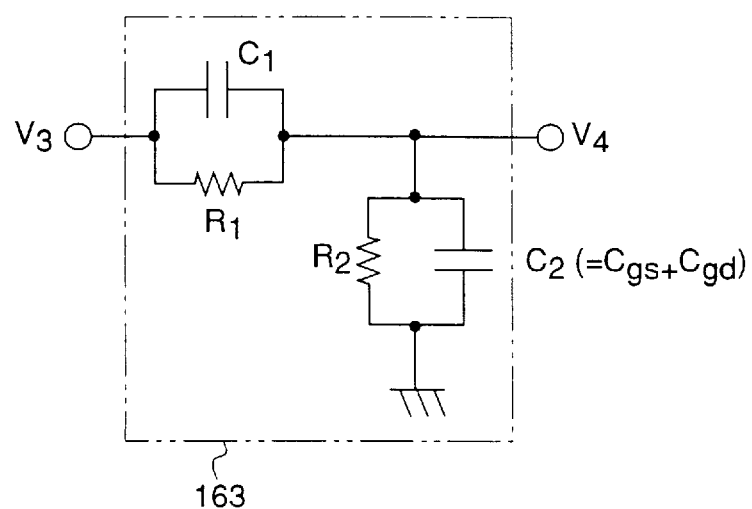

FIG. 7(a) is a circuit diagram illustrating a differential amplifier according to a fourth embodiment of the present invention. In the figure, the same reference numerals as those shown in FIG. 1 designate the same or corresponding parts. Reference numeral 163 designates a bias circuit for taking out a signal from the first level shift circuit 1 and inputting that signal to the gate terminal of the current source FET 9 of the second level shift circuit 2.

The fourth embodiment of the invention is characterized in that a resistor 21 is connected in parallel with the by-pass condenser 17 of the bias circuit according to the first embodiment. In addition, reference numerals 22 and 23 designate resistors constituting a bias circuit for equalizing the gate bias of the constant current source FET 5 of the first level shift circuit 1 to the gate bias of the current source FET 9 of the second level shift circuit 2. Reference numeral 24 designates a resistor for adjusting the gate-source resistance of the current source FET 9. By interposing the resistor 24, the gate-source voltage of the current source FET 9 can be set to 0 V or below. Reference numeral 25 designates a resistor for equalizing the gate-source voltage of the constant current source FET 5 to that of the current source FET 9.

In the bias circuits 16, 161 and 162 of the first to third embodiments, it is supposed that the by-pass condenser 17 can be regarded as short-circuited, i.e., the existence of the by-pass condenser can be ignored in view of the high frequency of the signal. Meanwhile, the bias circuit 163 according to the fourth embodiment is applicable to a low frequency region where the by-pass condenser 17 cannot be regarded as short-circuited. As the use frequency becomes low, the by-pass condenser 17 produces a phase change, i.e., phase lead, with respect to the (high frequency) output that is output from the first level shift circuit 1.

Accordingly, in the fourth embodiment of the invention, the respective resistors 21 to 25 as shown in FIG. 7(a) are provided so that the bias circuit 163 shown in FIG. 7(b) is equivalently constructed. In FIG. 7(b), $R_1$ represents the resistance of the resistor 21, $C_1$ represents the capacitance of the by-pass condenser 17, $R_2$ represents the resistance of the bias resistor 18, and $C_2$ represents the input capacitance of the gate terminal of the current source FET 9. In addition, the resistance of the resistor 24 is ignored assuming a resistance which is much smaller than the resistances of the bias resistor 18 and the resistor 21 is employed. In the bias circuit 163, when the voltage input from the first source follower circuit 1 to the bias circuit 163 is $V_3$ and the voltage generated at the gate terminal of the current source FET 9 is $V_4$, the current phase after flowing through the parallel circuit comprising the resistor 21 and the condenser 17 leads with respect to the voltage $V_3$, while the voltage $V_4$ generated when the current flows through the parallel circuit comprising the resistor 18 and the parasitic capacitance of the current source FET 9 lags with respect to the current phase.

Assuming that the phase angle of the current with respect to the input voltage in the parallel circuit comprising the resistor 21 and the condenser 17 is $\phi_1$ and the phase angle of the generated voltage $V_4$ with respect to the input current in the parallel circuit comprising the resistor 18 and the parasitic capacitance of the current source FET 9 is $\phi_2$, when $\phi_1$ is equal to $\phi_2$, the phases of the input voltages $V_3$ and $V_4$ become equal to each other. That is, in order for formulae $\phi_1 = \phi_2$ $\tan \phi_1 = \tan \phi_2$ $\omega C_1 R_1 = \omega C_2 R_2$ the resistances and the capacitances may be determined so as to be $C_1 R_1 = C_2 R_2$. Then, the phases are equal to each other independent of the frequency. Therefore, even when the use frequency changes, the phases in the bias circuit 163 do not change. Considering the amplitude of the voltage $V_4$ generated at the gate terminal of the current source FET 9, the ratio of $V_4$ to $V_3$ in the case where $C_1 R_1 = C_2 R_2$ is represented by $V_4/V_3 = R_2/(R_1 + R_2)$ and is kept uniform independent of the frequency.

As described above, according to the fourth embodiment of the invention, the resistor 21 is provided in parallel with the by-pass condenser 17 of the bias circuit, and the phase lead due to the condenser 17 is compensated by an adjustment using the parallel circuit comprising the resistor 18 and the parasitic capacitance of the current source FET 9, which is connected in series to the condenser 17. Therefore, even when the bias circuit 163 is employed at a low frequency region at which the by-pass condenser 17 cannot be regarded as short-circuited, the phase difference between the signals output from the first and second level shift circuits 1 and 2 can be made small, resulting in a differential amplifier including a bias circuit having no frequency characteristic.

Embodiment 5.

Figure 8:
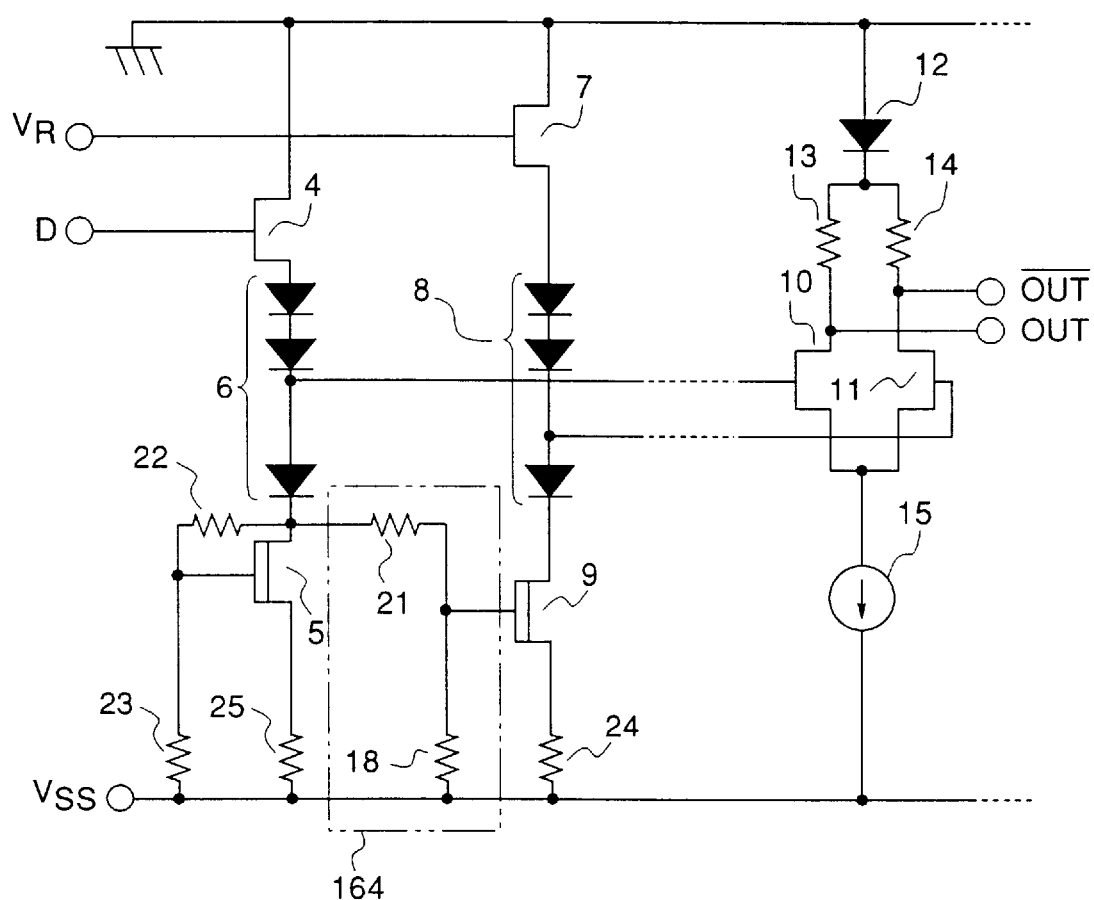
FIG. 8 is a circuit diagram illustrating a differential amplifier in accordance with a fifth embodiment of the present invention.

FIG. 8 is a circuit diagram illustrating a differential amplifier according to a fifth embodiment of the present invention. In the figure, the same reference numerals as those shown in FIG. 1 designate the same or corresponding parts. Reference numeral 164 designates a bias circuit for taking out a signal from the first level shift circuit 1 and inputting that signal to the gate terminal of the current source FET 9 of the second level shift circuit 2.

The fifth embodiment of the invention is characterized in that the by-pass condenser 17 of the bias circuit according to the fourth embodiment is removed and only the resistor 21 is provided.

In the bias circuit 163 of the fourth embodiment, the by-pass condenser 17 is unnecessary at a frequency region at which the input impedance of the current source FET 9 is seen to be quite large. Accordingly, the circuit shown in FIG. 8 has the same effects as those of the circuit of the fourth embodiment, in a range at which the input impedance of the current source FET 9 can be ignored.

As described above, according to the fifth embodiment of the invention, since the by-pass condenser is removed, considering that the by-pass condenser of the bias circuit is unnecessary at some frequency band at which the input impedance of the current source FET 9 is seen to be large, a reduction in the chip area is realized to that extent, i.e., by the area of the condenser.

Embodiment 6.

Figure 9:
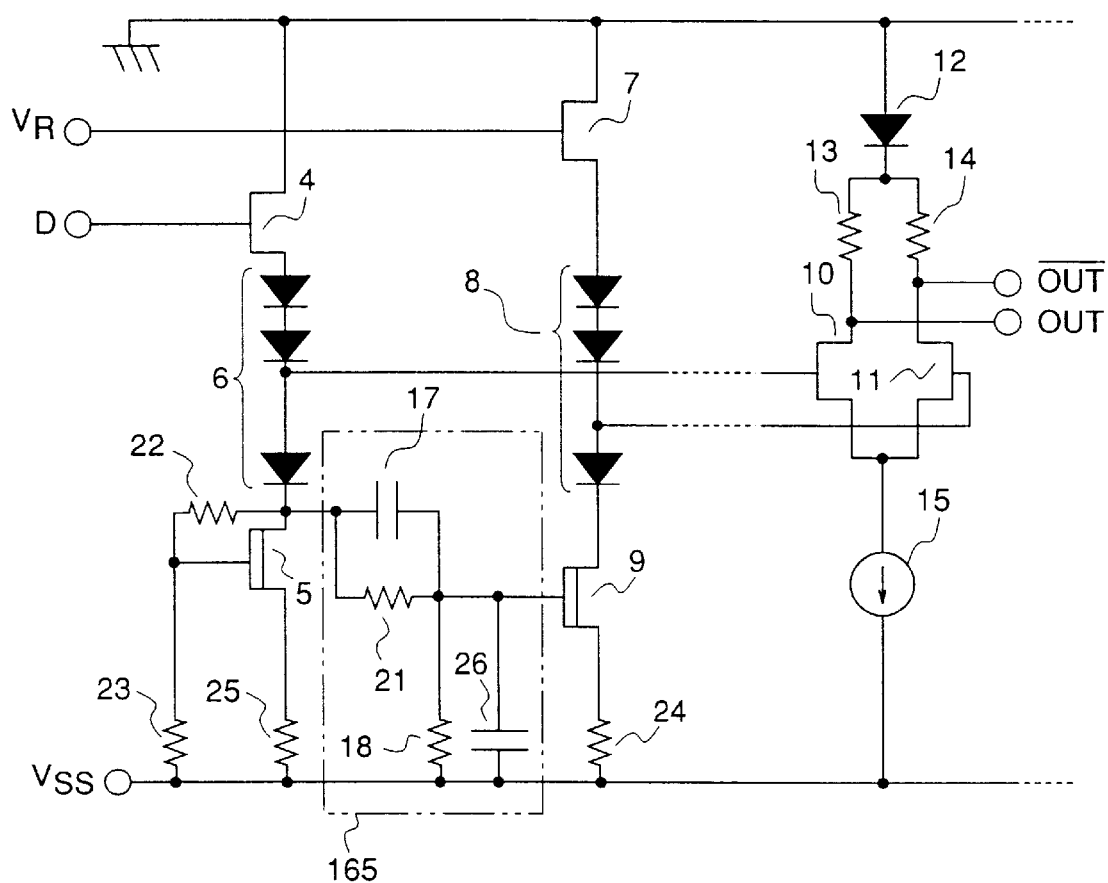
FIG. 9 is a circuit diagram illustrating a differential amplifier in accordance with a sixth embodiment of the present invention.

FIG. 9 is a circuit diagram illustrating a differential amplifier according to a sixth embodiment of the present invention. In the figure, the same reference numerals as those shown in FIG. 7(a) designate the same or corresponding parts. Reference numeral 165 designates a bias circuit for taking out a signal from the first level shift circuit 1 and inputting that signal to the gate terminal of the current source FET 9 of the second level shift circuit 2.

The sixth embodiment of the invention is characterized in that a condenser 26 is provided in parallel with the gate bias resistor 18 for the current source FET 9 of the bias circuit according to the fourth embodiment.

Figure 10:
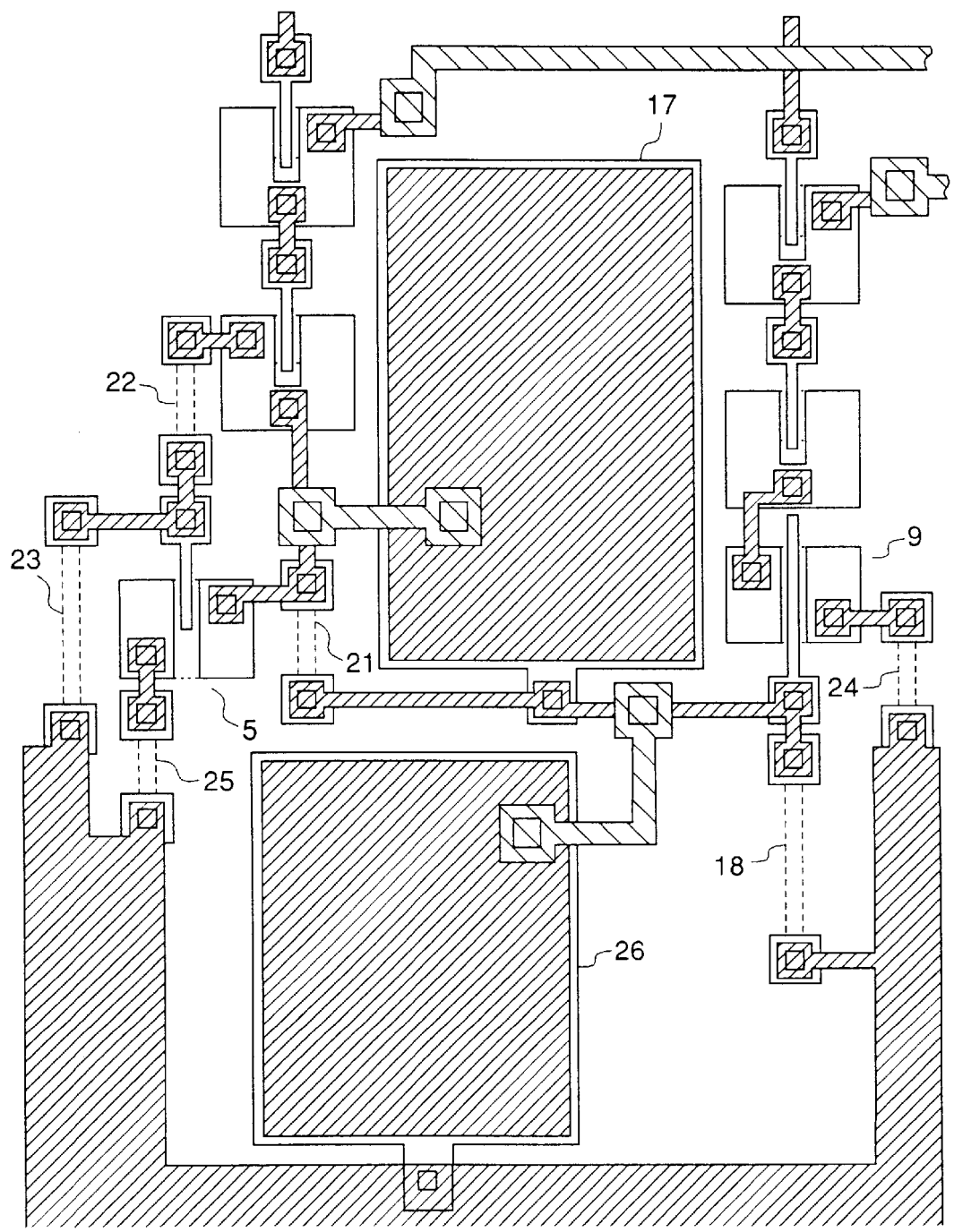
FIG. 10 is a diagram illustrating an instance of pattern layout of a bias circuit of the differential amplifier according to the sixth embodiment of the invention.

In using the bias circuit 163 according to the fourth embodiment, when the input capacitance of the current source FET 9 is extremely small, it is difficult to fabricate the by-pass condenser 17 with high precision when the by-pass condenser 17 is an MIM capacitor. Therefore, in the sixth embodiment of the invention, by connecting the condenser 26 having a larger capacitance $C_3$ which can realize the by-pass condenser 17, such as an MIM capacitor, in parallel with the input capacitance of the current source FET 9, $$C_1R_1=(C_2+C_3) \cdot R_2-C_3R_2 \text{ (here, } C_3>>C_2)$$

is obtained, and thus the fabrication of the by-pass condenser 17 is facilitated. FIG. 10 is a diagram illustrating pattern layout when the by-pass condenser 17 and the condenser 26 are MIM capacitors.

As described above, according to the sixth embodiment of the invention, when the input capacitance of the current source FET 9 is small, the condenser 26 is provided in parallel with the gate bias resistor 18 for gate biasing the current source FET 9, at the stage previous to the gate of the current source FET 9, and the input capacitance of the current source FET 9 is compensated to be seen as a large capacitance. Therefore, even when the input capacitance of the current source FET 9 is extremely small, the by-pass condenser 17 can be fabricated easily and with high precision by such as an MIM capacitor.

Embodiment 7.

Figure 11:
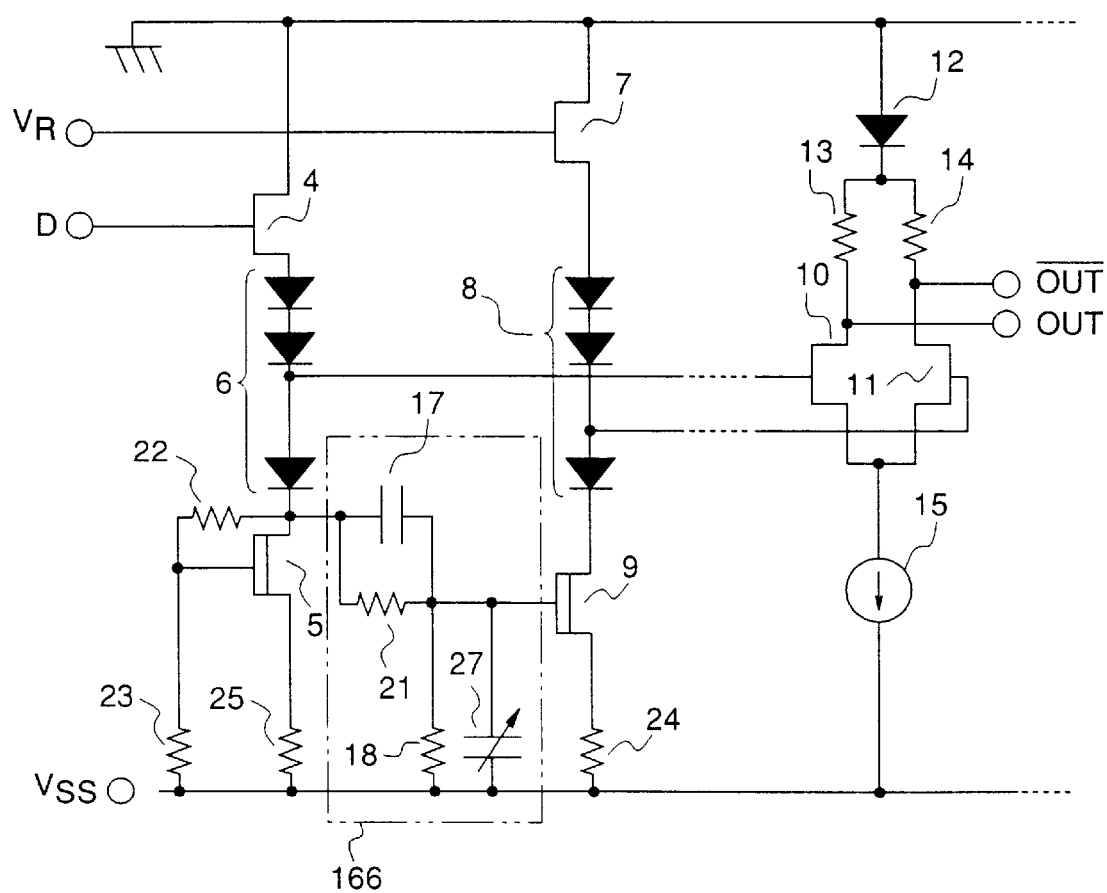
FIG. 11 is a circuit diagram illustrating a differential amplifier in accordance with a seventh embodiment of the present invention.

FIG. 11 is a circuit diagram illustrating a differential amplifier according to a seventh embodiment of the present invention. In the figure, the same reference numerals as those shown in FIG. 9 designate the same or corresponding parts. Reference numeral 166 designates a bias circuit for taking out a signal from the first level shift circuit 1 and inputting that signal to the gate terminal of the current source FET 9 of the second level shift circuit 2.

The seventh embodiment of the invention is characterized in that a variable capacitance condenser 27 having a variable capacitance is provided in place of the condenser 26 for compensating the input capacitance of the current source FET 9 of the bias circuit according to the sixth embodiment.

When an integrated circuit is actually made, the input capacitance of the current source FET 9 may vary with every process. Therefore, in the seventh embodiment of the invention, the variable capacitance condenser 27 is employed as a condenser connected in parallel with the bias resistor 18 correct variations in the input capacitance of the current source FET 9 due to the respective fabricating processes of the current source FET 9.

Figure 12:
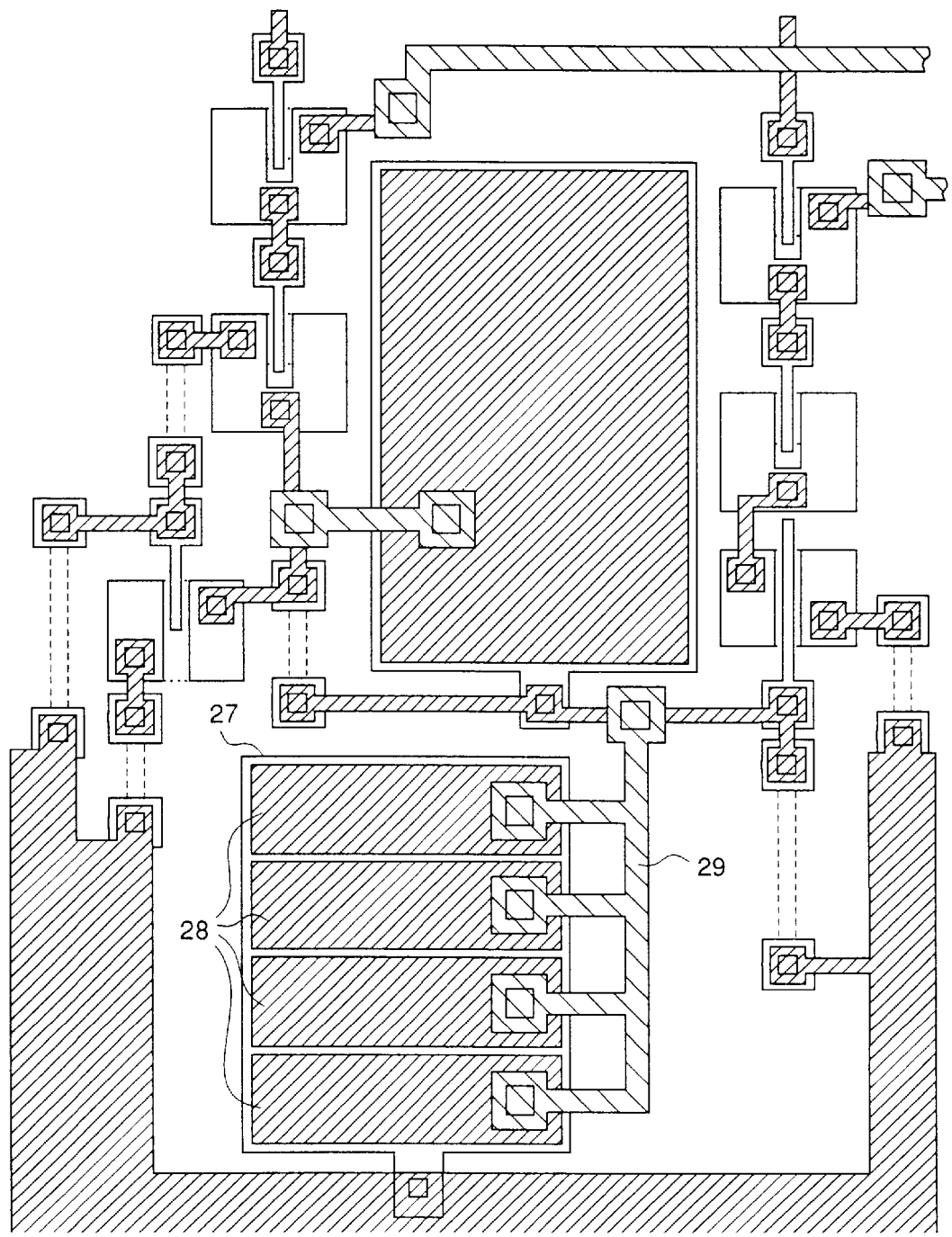
FIG. 12 is a diagram illustrating an instance of pattern layout with a variable capacitance condenser as the center, when the variable capacitance condenser is an MIM capacitor in the differential amplifier according to the seventh embodiment of the invention.

FIG. 12 is a diagram illustrating pattern layout when the variable capacitance condenser 27 described in the seventh embodiment is an MIM capacitor. An upper electrode 28 of the MIM capacitor is divided into portions of sizes each in a range of desired variable capacitance. The respective upper electrodes 28 are connected in parallel with a wiring 29. The wiring 29 may be cut with such as laser as required, whereby the capacitance of the condenser 27 can be adjusted.

As described above, according to the seventh embodiment of the invention, the variable capacitance condenser 27 is employed as a condenser for adjusting the input capacitance of the current source FET 9. Therefore, even when the input capacitance of the current source FET 9 varies with every fabricating process, the variations are properly amended, whereby fabrication yield can be improved.

Embodiment 8.

Figure 13:
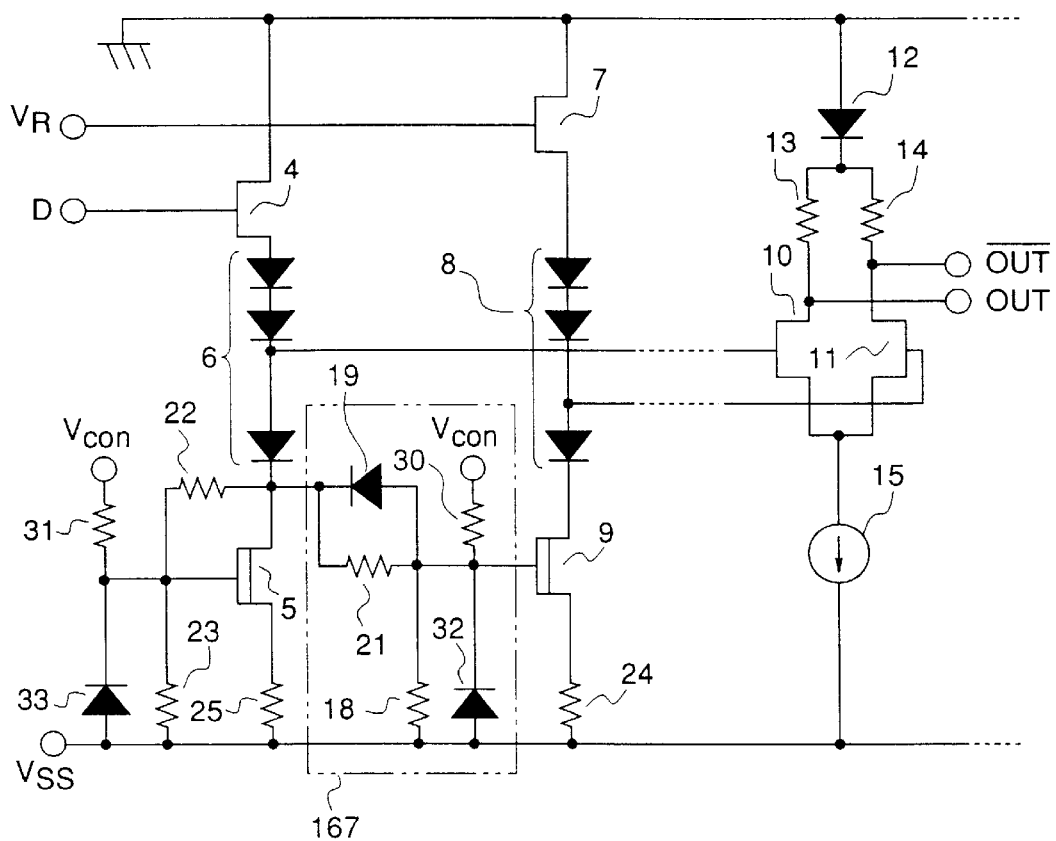
FIG. 13 is a circuit diagram illustrating a differential amplifier in accordance with an eighth embodiment of the present invention.

FIG. 13 is a circuit diagram illustrating a differential amplifier according to an eighth embodiment of the present invention. In the figure, the same reference numerals as those shown in FIG. 11 designate the same or corresponding parts. Reference numeral 167 designates a bias circuit for taking out a signal from the first level shift circuit 1 and inputting that signal to the gate terminal of the current source FET 9 of the second level shift circuit 2.

The eighth embodiment of the invention is characterized in that a diode 32 is provided in place of the variable capacitance condenser 27 of the bias circuit according to the seventh embodiment. By varying the voltage $V_{CON}$ supplied to the diode 32 through a resistor 30, the capacitance of the diode 32 can be varied. In addition, a diode 33 is added so that the gate bias of the current source FET 5 varies with the variation in the gate bias of the current source FET 9, and the voltage $V_{CON}$ is supplied to the diode 33 through a resistor 31.

As described above, according to the eighth embodiment of the invention, the diode 32 is employed as a capacitance element connected to the gate of the current source FET 9 so that the controlling voltage $V_{CON}$ is applied to the diode 32 through the resistor 30. Therefore, fine adjustment is possible, as compared with the MIM capacitor having used in the seventh embodiment. Further, even when there arises a phase shift between the first and second level shift circuits 1 and 2 due to secular variation during use, the phase shift can be corrected by adjusting the controlling voltage $V_{CON}$ externally.

What is claimed is:

1. A differential amplifier receiving a first input signal and a second input signal, respectively, and amplifying the voltage difference between the first and second input signals to output an output signal, the differential amplifier including:
   a first source follower circuit receiving an external data signal as a first input signal, and having an output node;
   a second source follower circuit having a constant current source FET and including a gate terminal receiving a reference voltage as a second input signal; and
   a bias circuit taking a signal in phase with the data signal from the output node of the first source follower circuit and inputting that signal to the gate terminal of the constant current source FET of the second source follower circuit, the bias circuit comprising:
      a by-pass condenser connecting the output node of the first source follower circuit to the gate terminal of the constant current source FET of the second source follower circuit; and
      a bias resistor connected to the gate terminal and supplying the gate bias of the current source FET of the second source follower circuit.

2. The differential amplifier of claim 1 including an inductor connected in series with the bias resistor to compensate phase lag caused by input capacitance of the current source FET of the second source follower circuit.

3. The differential amplifier of claim 1 including a resistor connected in parallel with the by-pass condenser to compensate phase lead caused by the by-pass condenser.

4. The differential amplifier of claim 3 including a condenser connected in parallel with the bias resistor to increase input capacitance of the current source FET of the second source follower circuit.

5. The differential amplifier of claim 4 wherein the condenser is a variable capacitance condenser.

6. The differential amplifier of claim 5 wherein the variable capacitance condenser comprises an MIM capacitor including an upper electrode having plural parts connected by respective wirings to the by-pass resistor, respective wirings being selectively disconnectable to produce a desired capacitance.

7. The differential amplifier of claim 5 wherein the variable capacitance condenser is a diode.

8. A differential amplifier receiving a first input signal and a second input signal, respectively, and amplifying the voltage difference between the first and second input signals to output an output signal, the differential amplifier including:

a first source follower circuit receiving an external data signal as a first input signal, and having an output node;

a second source follower circuit having a constant current source FET and including a gate terminal receiving a reference voltage as a second input signal; and a bias circuit taking a signal in phase with the data signal from the output node of the first source follower circuit and inputting that signal to the gate terminal of the constant current source FET of the second source follower circuit, the bias circuit comprising:

a reverse-biased diode connecting the output node of the first source follower circuit to the gate terminal of the constant current source FET of the second source follower circuit; and a bias resistor connected to the gate terminal and supplying the gate bias of the current source FET of the second source follower circuit.

9. A differential amplifier receiving a first input signal and a second input signal, respectively, and amplifying the voltage difference between the first and second input signals to output an output signal, the differential amplifier including:

a first source follower circuit receiving an external data signal as a first input signal, and having an output node;

a second source follower circuit having a constant current source FET and including a gate terminal receiving a reference voltage as a second input signal; and a bias circuit taking a signal in phase with the data signal from the output node of the first source follower circuit and inputting that signal to the gate terminal of the constant current source FET of the second source follower circuit, the bias circuit comprising:

a by-pass resistor connecting the output node of the first source follower circuit to the gate terminal of the constant current source FET of the second source follower circuit; and a bias resistor connected to the gate terminal and supplying the gate bias of the current source FET of the second source follower circuit.

* * * * *